United States Patent

[11] 3,548,076

[72] Inventors Reginald Benjamin William Cooke Hertfordshire; George Ellwood, Essex, England
[21] Appl. No. 847,868
[22] Filed Aug. 6, 1969
[45] Patented Dec. 15, 1970
[73] Assignee International Standard Electric Corporation New York, N.Y. a corporation of Delaware
[32] Priority Nov. 27, 1968
[33] Great Britain
[31] No. 56285/68

[54] ELECTRIC CIRCUIT PACKAGE
3 Claims, 3 Drawing Figs.

[52] U.S. Cl. .......... 174/52, 174/50.56, 174/50.61; 206/56; 317/101, 317/234
[51] Int. Cl. .......... H05k 5/06
[50] Field of Search .......... 174/FD, 52.5, 52.6, 50.5, 50.6, 50.61, 50.63; 317/101A, 101CP, 234/4; 206/56A

[56] References Cited
UNITED STATES PATENTS
3,320,351 5/1967 Glickman .......... 174/50.5

*Primary Examiner*—Darrell L. Clay
*Attorneys*—C. Cornell Remsen, Jr., Walter J. Baum, Paul W. Hemminger, Percy P. Lantzy, Philip W. Bolton, Isidore Togut and Charles L. Johnson, Jr.

ABSTRACT: This is a package arrangement for hybrid circuits requiring a large number of leadouts. The package has a rectangular metal frame comprising two L-shaped portions, at least one portion containing a plurality of leads passing therethrough and insulated therefrom with glass to metal seals. The substrate containing the circuit is supported by a base member and connections are made between the leads and corresponding terminals on the substrate. A lid is then placed on the assembly to hermetically seal the package.

PATENTED DEC 15 1970

3,548,076

Inventors
REGINALD B. W. COOKE
GEORGE ELLWOOD
By Stephen A. Young
Attorney

ELECTRIC CIRCUIT PACKAGE

BACKGROUND OF THE INVENTION

This invention relates to electrical circuit packages and to housing assemblies for electrical circuits.

SUMMARY OF THE INVENTION

It is an object of this invention to provide an improved housing assembly for electrical components and for circuits.

According to the invention there is provided a housing assembly for an electrical circuit including an enclosing wall consisting of two separate wall forming members with electrical conductor wires insulatingly sealed through at least one of said members.

DESCRIPTION OF THE PREFERRED EMBODIMENTS

Figure 1:
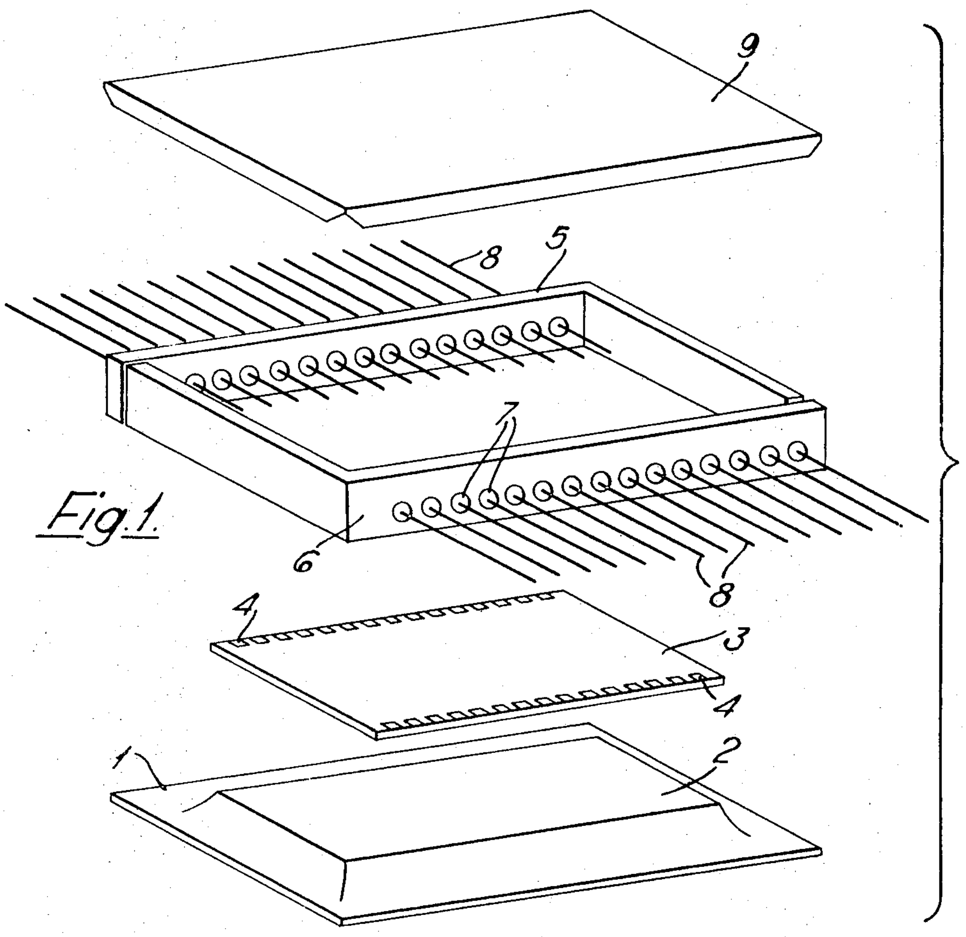
FIG. 1 is a perspective exploded view of an electrical circuit package.

Referring to FIG. 1, the housing assembly of the package comprises a metal base plate 1 of inverted dish shape with a raised central portion 2. The area of the central portion approximates to that of a substrate 3 which carries electrical components (not shown) and is provided with terminal areas 4 along its two major sides.

The substrate electrical components are already interconnected as required for the desired electrical circuit function of the substrate, and this interconnection includes connection with the terminal areas 4.

The housing assembly of the package further comprises two L-shaped metal members 5 and 6, each dimensioned so that the lengths of the two limbs of the L correspond respectively to the length and width of the base plate 1. The members are arranged as shown to define in combination a rectangular frame which forms the sidewalls of the package. Insulatingly sealed through each longer limb of the members 5 and 6 by glass seals 7 is a row of electrical conductor wires 7 on the same pitch spacing as the pitch spacing between the terminal areas 4 on the substrate 3. There is a metal top plate or lid 9 for the housing assembly of the package.

Figure 2:
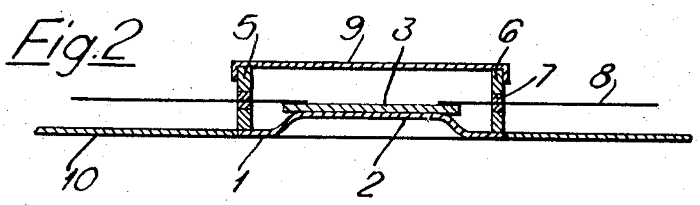
FIG. 2 is a sectioned assembled view of the electrical circuit package.

Referring additionally to FIG. 2, the package is assembled by first bonding the underside of the substrate to the raised central portion 2 of the base plate 1. Then the two members 5 and 6 are placed on the base plate 1 to define the sidewalls framework. At this state of assembly the pair of abutting ends of the two members 5 and 6 are fastened together by soldering or by adhesive, and the lower edges of the members 5 and 6 abutting the top outer surface of the base plate 1 are fastened to the base plate by soldering or by adhesive. Subsequently to these fastening operations, the inner ends of the wires 8 are bonded to their respective terminal areas 4 on the substrate 3. Finally the lid 9 is attached, by soldering or by adhesive, to achieve a hermetic package. As indicated in FIG. 2 the base plate 1 may be extended beyond the boundaries of the package on one or more sides so forming a heat sink fin 10 to ease heat dissipation problems when large numbers of packages are used. When stacked the fins line up into a radiator configuration to assist cooling of the equipment.

Figure 3:
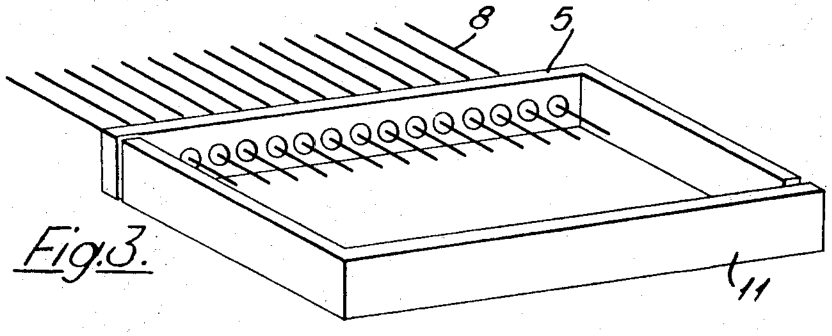
FIG. 3 is a perspective view of a modified part of the package.

As shown in FIG. 3, one of the L-shaped members forming the sidewall framework of the package may be a plain metal L-shaped member 11 without wires and seals so that the package has conductor wires extending through one side only.

The connected substrate may be potted within the sidewall framework in which case the lid 9 may be dispensed with.

We claim:

1. A housing assembly an electrical circuit comprising:
   - a base plate having a raised portion on one surface thereof;
   - a substrate containing a plurality of terminals along the periphery of one surface thereof, said substrate being attached to said raised portion of said base plate;
   - a rectangular metal frame having two L-shaped portions attached to a part of the remaining portion of the surface of said base plate and surrounding said substrate, one side of each L-shaped portion having a plurality of holes formed therein;
   - a plurality of conductive leads, each lead passing through one hole in said metal frame and attached to one of said terminals on said substrate, each conductive lead being insulated from said metal frame by a glass-to-metal seal formed within each hole in said frame; and
   - a lid bonded to said metal frame hermetically sealing said assembly.

2. A housing assembly according to claim 1 wherein said raised portion is centrally located on the surface of said base plate.

3. A housing assembly according to claim 2 wherein said base plate is comprised of a metal and said metal extends beyond the boundaries of said metal frame to form a heat sink fin so as to improve the heat dissipation of said assembly.

UNITED STATES PATENT OFFICE

CERTIFICATE OF CORRECTION

Patent No. 3,548,076 Dated December 15, 1970

Inventor(s) Reginald Benjamin William Cooke-George Ellwood

It is certified that error appears in the above-identified patent and that said Letters Patent are hereby corrected as shown below:

Claim 1, line 1, after "assembly" insert therein --enclosing--.

Signed and sealed this 13th day of July 1971.

(SEAL)
Attest:

EDWARD M.FLETCHER,JR.
Attesting Officer

WILLIAM E. SCHUYLER, JR.
Commissioner of Patents